United States Patent [19]

Hirao

[11] 4,445,268

[45] May 1, 1984

[54] METHOD OF MANUFACTURING A SEMICONDUCTOR INTEGRATED CIRCUIT BI-MOS DEVICE

[75] Inventor: Tadashi Hirao, Hyogo, Japan

[73] Assignee: Mitsubishi Denki Kabushiki Kaisha, Tokyo, Japan

[21] Appl. No.: 348,541

[22] Filed: Feb. 12, 1982

[30] Foreign Application Priority Data

Feb. 14, 1981 [JP] Japan ............................ 56-20351
Mar. 5, 1981 [JP] Japan ............................ 56-32981

[51] Int. Cl.³ .................... H01L 21/225; H01L 21/76
[52] U.S. Cl. ............................ 29/571; 29/576 W; 29/577 C; 29/578; 29/591; 148/174; 148/187; 148/188; 156/653; 156/657; 156/662; 357/43; 357/49; 357/50
[58] Field of Search ............... 29/571, 576 W, 577 C, 29/578, 591; 148/174, 187, 188; 156/653, 657, 662; 357/43, 48-50

[56] References Cited

U.S. PATENT DOCUMENTS

| | | | |
|---|---|---|---|
| 3,756,876 | 9/1973 | Brown et al. | 29/578 X |
| 3,767,487 | 10/1973 | Steinmaier | 357/43 X |
| 4,032,372 | 6/1977 | Vora | 29/571 X |
| 4,151,631 | 5/1979 | Klein | 29/578 X |
| 4,299,024 | 11/1981 | Piotrowski | 29/578 X |

*Primary Examiner*—W. G. Saba
*Attorney, Agent, or Firm*—Sughrue, Mion, Zinn, Macpeak and Seas

[57] ABSTRACT

A method of manufacturing a semiconductor integrated circuit of the BI-MOS type on a common semiconductor substrate comprising forming an oxide film by thermal oxidation to isolate the elements and a base layer of one conductivity type by a surrounding dielectric followed by removing the oxide film from emitter and collector electrode extending regions. A silicon film of a second conductivity type is formed by patterning and used to form an emitter layer and a collector extending layer by differing purities from the silicon film. Patterning is then employed to form gate, emitter and collector electrodes. Finally, the mask for the silicon film is used to form a base electrode extending layer, a source layer and a drain layer of the first conductivity type and of high impurity density.

5 Claims, 16 Drawing Figures

4,445,268

METHOD OF MANUFACTURING A SEMICONDUCTOR INTEGRATED CIRCUIT BI-MOS DEVICE

BACKGROUND OF THE INVENTION

This invention relates to a method of manufacturing a semiconductor integrated circuit device, and more particularly, to a method of manufacturing a so-called "BI-MOS" integrated circuit device in which both a MOS element and a bipolar element are formed on one and the same chip.

In general, bipolar elements are high in drive capacity per chip area, and can process analog data with high accuracy. However, bipolar elements also have a relatively low degree of integration, and low input impedances. On the other hand, among the features of MOS elements are high input impedances and a large degree of integration. Accordingly, it is advantageous to form a MOS element on a chip which essentially includes a bipolar element, such that the above-described drawbacks of the bipolar elements are neutralized. One typical example in the prior art of such a device is a so-called "MOS top operational amplifier" in which a MOS element is formed in the input stage of the bipolar element. In such BI-MOS integrated circuit devices, an npn transistor is employed as the bipolar element, and a p-channel MOS transistor is employed as the MOS element. A conventional method of manufacturing such a BI-MOS integrated circuit will now be described in further detail, with reference to FIG. 1.

As shown in FIG. 1(A), after layers 2 of n-type high impurity concentration are formed on a p-type silicon substrate 1, an epitaxial layer 3 of n-type low impurity concentration is grown onto the layers 2 and the substrate (1). Then, as shown in FIG. 1(B), oxidation is selectively carried out with an oxidation resisting film 4 such as a nitride operating as a mask, so that thick oxide films 5 are formed which electrically isolate the element forming regions 3a and 3b in the epitaxial layer 3 from each other.

In FIG. 1(C), the nitride film 4 is then removed, and an oxide film 6 is formed as a protective film for implanting ions. A photo-resist film 7 is formed, and boron ions are implanted into the semiconductor surface through the oxide film 6 with the photo-resist film 7 serving as a mask. The photo-resist film 7 is removed, and the boron ions are subjected to driving diffusion by heat treatment, such that a p-type base layer 8, a source layer 9, a drain layer 10 and a diffusion resistor (not shown) are formed in the epitaxial layer 3. Then, as shown in FIG. 1(D), a collector contact n' layer 11 and an emitter n+ layer 12, which are both of n-type high impurity concentration, are formed by ion implantation or gas diffusion. Next, as in FIG. 1(E), an oxide film 13 such as a phospho-silicate-glass film is deposited. The parts of the oxide film 13 and 6 where a gate should be formed are then removed, and a gate oxide film 14 is formed therein. Finally, as shown in FIG. 1(F), after windows are opened in the oxide film 13 and 6 to provide the electrodes, a base electrode 15, an emitter electrode 16, a collector electrode 17, a source electrode 18, a gate electrode 19, and a drain electrode 20 are formed along with the various other necessary connecting wires (not shown).

In general, when manufacturing a BI-MOS integrated circuit device, it is essential to control the characteristic parameters of each element with high accuracy. Among the characteristic parameters which must be thus controlled are:

(1) the junction breakdown voltage of each element, (2) the current amplification factor $h_{fe}$ of the npn transistor, and/or the current amplification factor $h_{fe}$ of the pnp transistor, (3) the threshold voltage (Vth) of the p-channel MOS transistor, and (4) the resistance (R) of the diffusion resistor.

In the process above-described as shown in FIGS. 1(A)–1(F), after the n+ emitter diffusion has been accomplished, a high temperature heat treatment is carried out to form the gate oxide film. By virtue of this subsequent heat treatment, the n+ layer as diffused is distributed again; that is, the n+ layer diffuses further into the p+ layer. Accordingly, it is very difficult to control the $h_{fe}$ of the npn transistor in the bipolar circuit with high accuracy. This is the most serious problem involved in manufacturing a BI-MOS integrated circuit.

In order to overcome this difficulty, the $h_{fe}$ of the npn transistor has been controlled highly accurately in the prior art by the following methods:

(a) Merely accounting for the variation of $h_{fe}$ due to the subsequent heat treatment by allowing the n+ layer to only diffuse so far;

(b) In the n+ emitter diffusion, only allowing the n+ deposition to be carried out; that is, the n+ layer is merely deposited, without being allowed to diffuse into the p+ layer. After all the heat treatment required for forming the MOS gate oxide film is carried out, the heat treatment for the n+ layer is then carried out in an inert atmosphere; and (c) Forming the gate oxide film of the MOS element at low temperature, after the n+ emitter diffusion.

These methods, while achieving high control of $h_{fe}$, present drawbacks of their own. For instance, in method (a), since the heat treatment carried out thereafter typically greatly fluctuates, it is difficult to estimate the amount of variations of $h_{fe}$ with high reproducibility. In method (b), during the subsequent heat treatment with inert gas, Vth of the MOS element becomes unstable. Finally, in method (c), it is difficult to accurately control the levels of the silicon substrate and the gate oxide film of the MOS element, again producing instabilities in Vth of the MOS element.

SUMMARY OF THE INVENTION

Accordingly, the present invention is designed to eliminate the above-described difficulties in the control of the parameters $h_{fe}$ and Vth. More specifically, an object of the present invention is to provide a method of manufacturing a semiconductor integrated circuit device, in which the gate oxide film is formed before the emitter layer, thereby eliminating a factor by which the parameter Vth is made unstable as well as improving the overall control of the parameter $h_{fe}$.

DESCRIPTION OF THE PREFERRED EMBODIMENTS

Figure 1A:
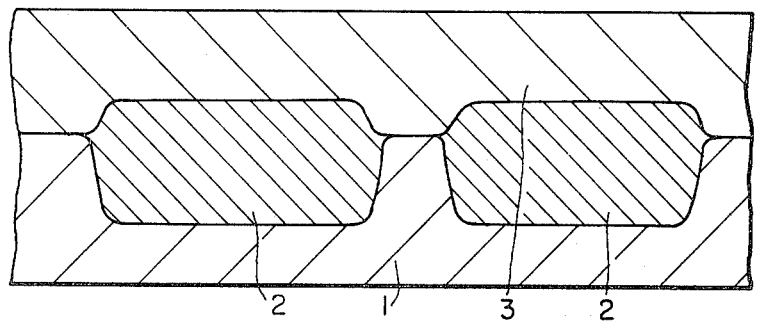
FIGS. 1(A)–1(F) are sectional views of the various manufacturing steps of a conventional method of manufacturing a BI-MOS integrated circuit device.
Figure 1B:
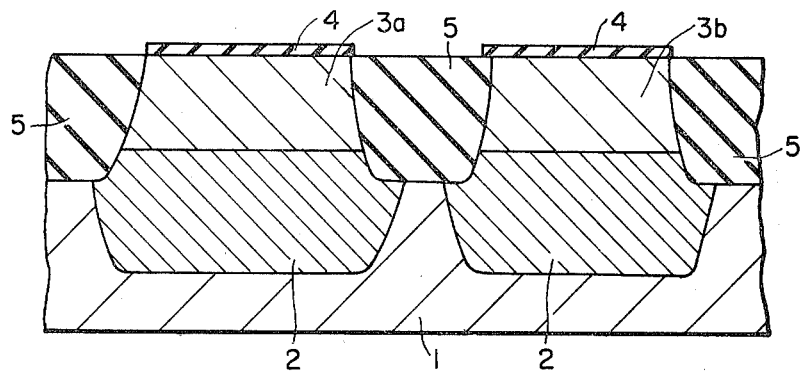
Figure 1C:
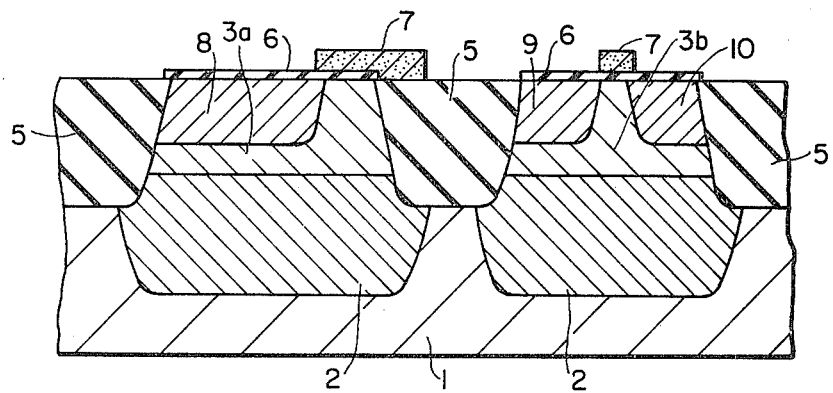
Figure 1D:
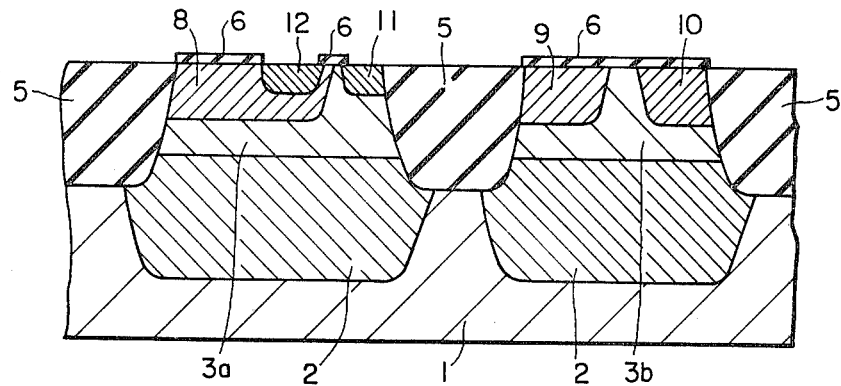
Figure 1E:
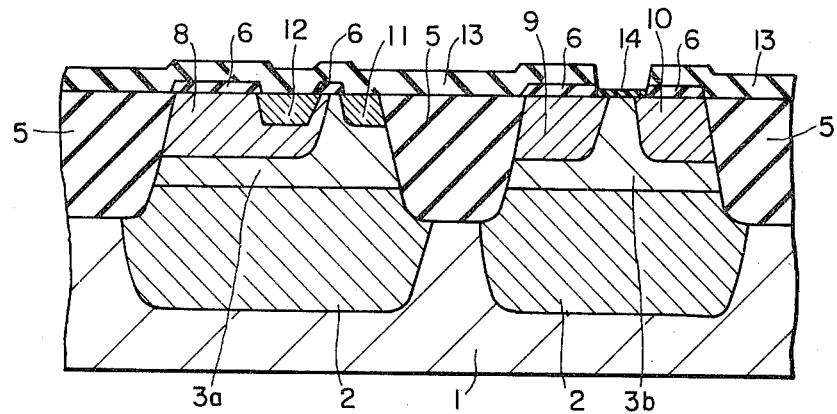
Figure 1F:
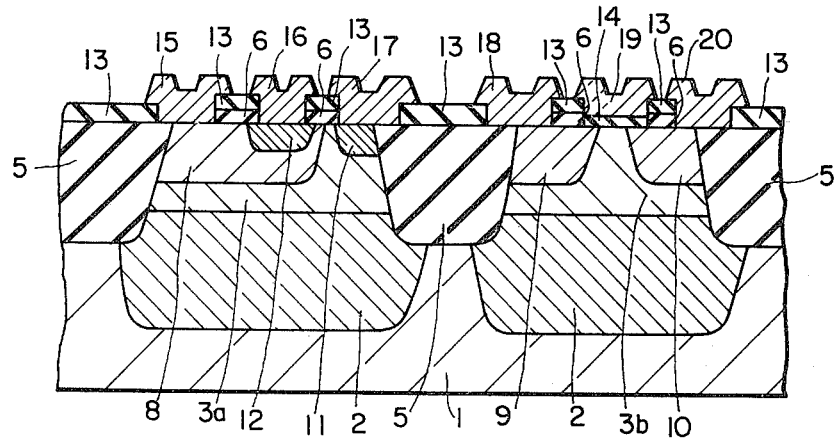
Figure 2A:
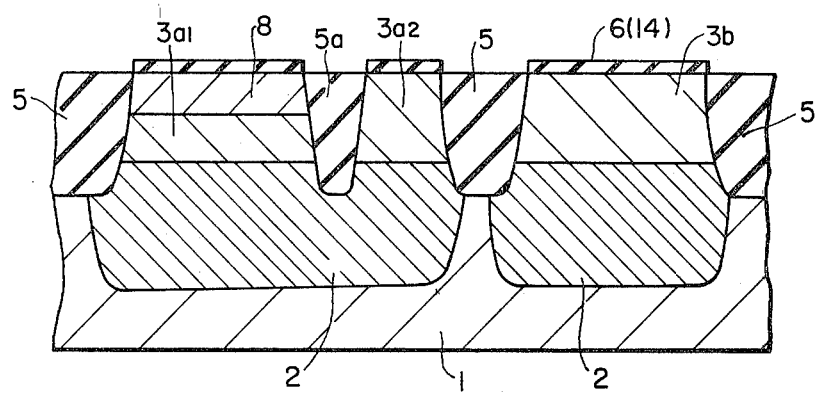
FIGS. 2(A)–2(E) are sectional views of the various manufacturing steps in the first embodiment of the method of manufacturing a semiconductor integrated circuit device according to the present invention.

FIGS. 2(A)–2(E) show a first embodiment of the method of manufacturing a semiconductor integrated circuit device according to the present invention. First, according to a method similar to the conventional method as previously described with reference to FIG. 1, buried layers 2 and an epitaxial layer 3 are formed. Then, as shown in FIG. 2(A), a thick oxide film 5 is formed, by an oxidation resisting mask such as a silicon nitride film, which isolates the element forming regions 3a and 3b of the epitaxial layer 3. Simultaneously, an oxide film 5a is formed which surrounds the base region forming portion 3a1 of the bipolar transistor and isolates the portion 3a1 from a collector contact forming portion 3a2. The oxidation resisting mask is then removed, a thin oxide film 6 is formed, and a p-type base layer 8 is formed according to a conventional selective diffusion method such as an ion implanting method. At this point, channel doping ion implantation is carried out, if necessary. Furthermore, if necessary, the oxide film 6 is removed and an oxide film 14 for a MOS gate is newly formed by thermal oxidation.

Figure 2B:
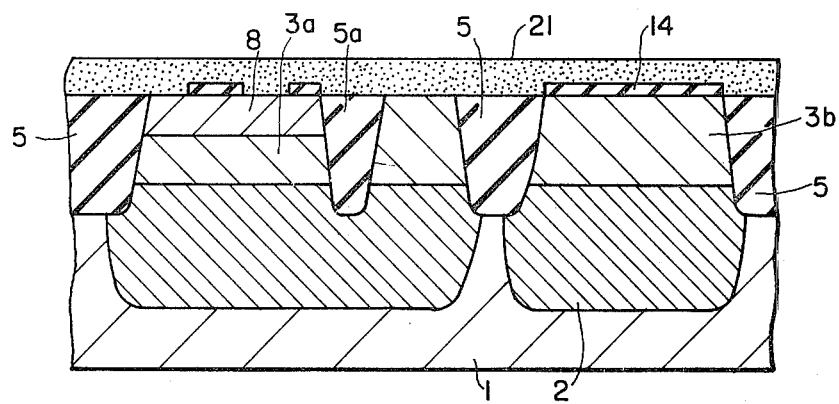

Thereafter, as shown in FIG. 2(B), the regions of the oxide film 14 where emitter and collector electrodes are to be provided, are removed by a conventional photomechanical process are etching technique, and a silicon film 21 containing n-type impurities is formed. The silicon film 21 may comprise of poly-crystalline silicon, an epitaxial growth silicon or a porous silicon. The n-type impurities may be either doped during or diffused after, the silicon film formation.

Figure 2C:
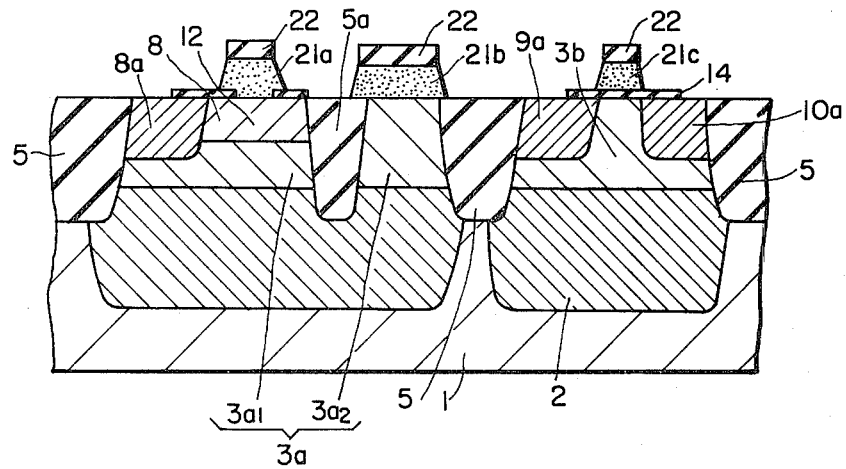

Then, as shown in FIG. 2(C), a photoresist film 22 is formed by photolithography, and the silicon film 21 is etched with the photoresist film 22 as a mask, such that an emitter electrode region 21a, a collector electrode region 21b and a gate electrode region 21c are formed. P-type impurities are also implanted with the photoresist film 22 as a mask, such that a base electrode extending layer 8a, a source 9a and a drain 10a are formed.

Figure 2D:
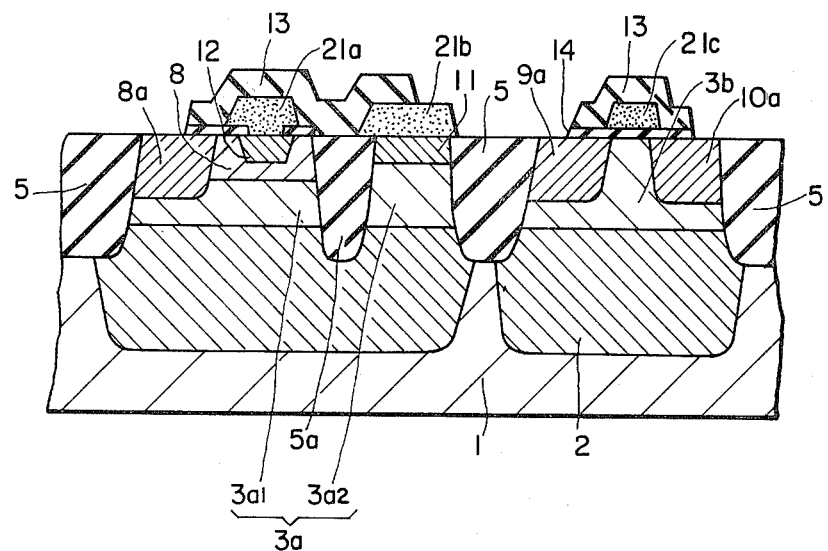

Thereafter, as in FIG. 2(D), both an emitter layer 12 of n-type high impurity density and a collector electrode extending layer 11 are formed by annealing treatment (with the silicon films 21a and 21b acting as diffusion sources) and a phospho-silicate-glass film 13 is deposited as a passivation film.

Figure 2E:
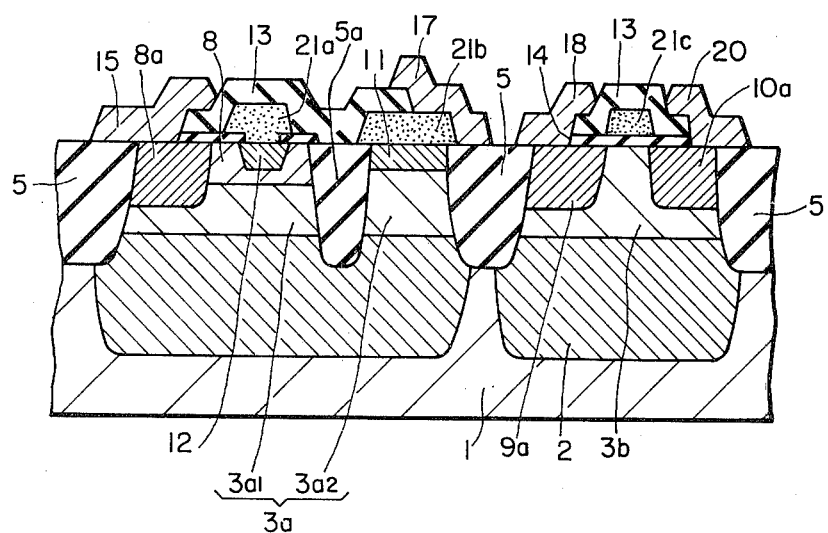

Finally, as shown in FIG. 2(E), windows are out into the phospho-silicate-glass film 13 and the oxide film 14 to provide contacts for the base layer 8, the source layer 9a, the drain layer 10a, and the poly-crystalline silicon film 21. Aluminum electrodes 15, 17, 18 and 20 as well as wiring layers (not shown) are then formed.

Figure 3:
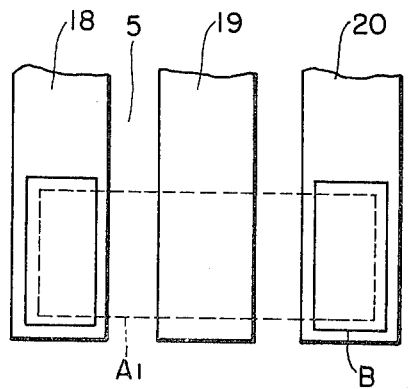
FIG. 3 is a top view of the MOS transistor in BI-MOS device produced by the conventional method of manufacture.
Figure 4:
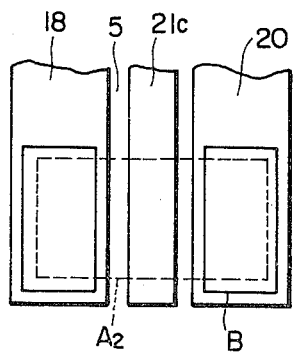
FIG. 4 is a top view of the MOS transistor in BI-MOS device produced by either of the embodiments of the method of manufacture according to the present invention.

By surrounding the base with the oxide film, the source and drain of the MOS transistor are formed in a self-alignment mode with the mask which is used to form the poly-crystalline silicon film pattern. Therefore, the area which is occupied by the self-alignment poly-crystalline silicon gate MOS transistor according to the present invention, i.e., the area bounded by A2 in FIG. 4 (which is a top view of FIG. 2(E)) is approximately 68% of the area occupied by the conventional aluminum gate MOS transistor, i.e., the area bounded by AI in FIG. 3 (which is a top view of FIG. 1(E)).

Figure 5A:
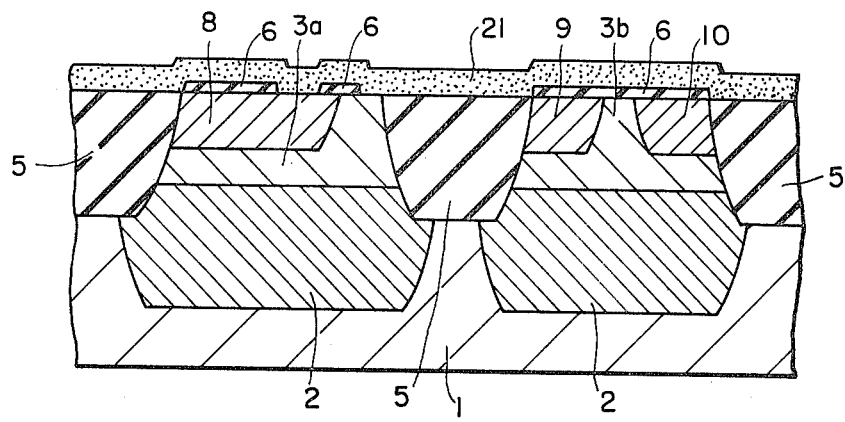
FIGS. 5(A)–5(C) are sectional views showing various manufacturing steps in a second embodiment of the method according to the present invention.
Figure 5B:
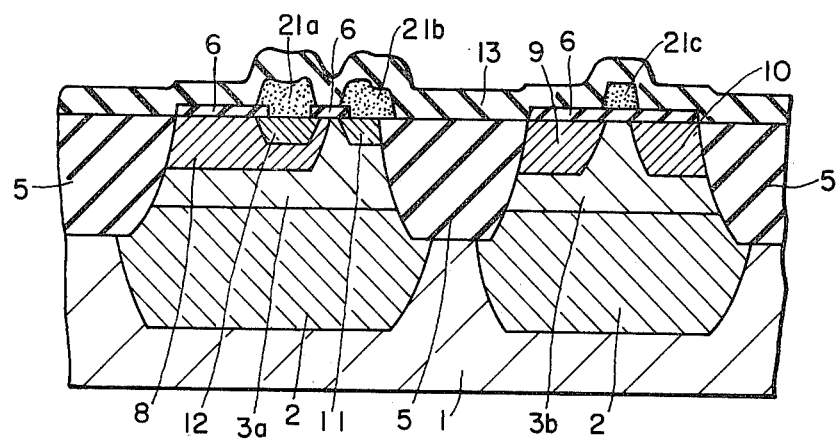
Figure 5C:
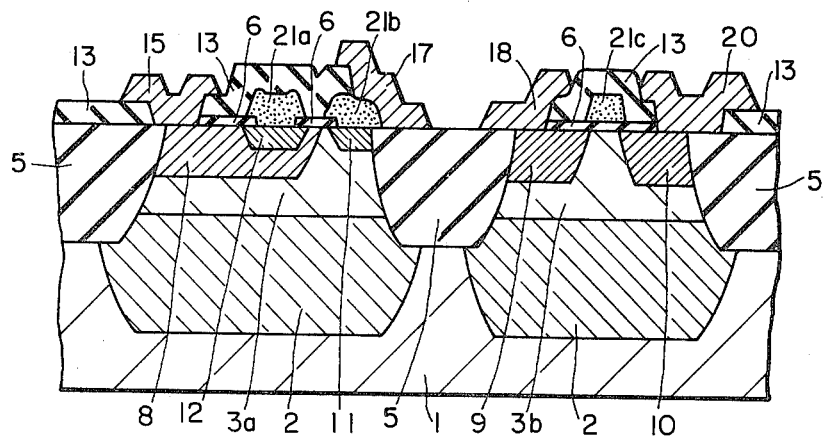

FIGS. 5(A)–(C) show a second embodiment of the method of manufacturing a semiconductor integrated circuit device according to the present invention. First, similarly as in the conventional method described with reference to FIG. 1, a base layer 8, a source layer 9 and a drain layer 10 are formed. Then, as shown in FIG. 5(A), the channel of the MOS element is subjected to doping implantation for control of the threshold volage(Vth), as necessary. Windows are then created by either conventional photomechanical processes or conventional etching techniques in the portions of the oxide film 6 where emitter and collector diffusion is to be carried out. A silicon film 21 is then deposited on the entire surface, and the oxide film beneath the silicon film 21 is used as the gate oxide film of the MOS element. This being the case, it is preferable to use a method in which, after ion implantation, the oxide film 6 can be removed and a clean gate oxide film be newly formed. A poly-crystalline silicon, an epitaxial growth silicon or a porous silicon may be employed as the aforementioned silicon film 21. Next, the poly-crystalline silicon film 21 is subjected to an n-type high impurity density diffusion, and with this treated silicon film 21 as a diffusion source, both an emitter layer 12 and a collector electrode extending layer 11 are formed, as shown in FIG. 5(B). Thereafter, the poly-crystalline silicon film 21 is patterned by either conventional photomechanical processes or conventional etching techniques to form a gate electrode 21c, a collector electrode 21b and an emitter electrode 21a. A phosphorous glass film 13 is then deposited thereto, and as shown in FIG. 5(C), windows are cut into both the phospho-silicate glass film 13 and the oxide film 6 to provide contacts for the base 8, the source 9, the drain 10, and the poly-crystalline silicon film 21, and aluminum electrodes 15, 18 20 and 17 and other wiring (not shown) are then formed.

The method of the present invention has been described with reference to the isolation of elements with an oxide film, however, it is to be understood that the technical concepts of the invention are equally applicable to the isolation of elements with a (p+) (n) junction.

As was described above, in the second embodiment of the method of manufacturing a semiconductor integrated circuit device according to the present invention, after the gate oxide film is formed, an emitter diffusion window is opened, and the poly-crystalline silicon film of n type high impurity concentration is used as both a diffusion source for the formation of the emitter through diffusion and a source of formation of the gate electrode. In the use of this method, it is unnecessary to carry out heat treatment at high temperature (such as gate oxidation after the emitter diffusion) such that the parameter $h_{fe}$ of the bipolar transistor can be determined with high accuracy. Further, this lack of heat treatment eliminated the instabilities in the threshold voltage (Vth), further improving the control of the parameter $h_{fe}$. In addition, since the electrode leads comprise poly-crystalline silicon, they are of greater resistivity than conventional leads, thereby increasing the input impedance of the device. Therefore, the method of the present invention results in a BI-MOS device which has a high degree of integration, high reliability in its key parameters, and high input impedance. Such a device is of great commercial utility, in that it combines the beneficial qualities of conventional bipolar and MOS devices while eliminating the drawbacks inherent in such bipolar devices.

Modifications of this invention will be apparent to those of working skill without departing from the essential scope of this invention.

I claim:

1. A method of manufacturing a BI-MOS semiconductor integrated device, comprising:

masking an epitaxial layer of a silicon substrate;

selectively oxidizing said epitaxial layer to form a first oxide film whereby element formation regions are defined and electrically isolated from one another in a pattern as defined by said masking;

forming a second oxide film on said epitaxial layer;

masking said second oxide film;

diffusing impurity ions through said second oxide film, whereby a base layer, a source layer and a drain layer are formed of a first dopant type;

removing said second oxide film at predetermined points, whereby said predetermined points correspond with points where emitter and collector diffusion is to be completed;

forming a silicon film on said epitaxial layer of a second dopant type;

diffusing said silicon film into said element formation regions, such that both an emitter layer and a collector extending layer are formed of said second dopant type;

removing said silicon film at predetermined points, whereby the remaining film forms a gate electrode, a collector electrode, and an emitter electrode, of said second dopant type; and providing insulation and electrical contact means to electrically address the transistor elements.

2. The method of manufacturing a BI-MOS semiconductor integrated device of claim 1, wherein said silicon film comprises poly-crystalline silicon, epitaxial growth silicon or porous silicon.

3. The method of manufacturing a BI-MOS semiconductor integrated device of claim 1, wherein said insulation comprises phosphorous glass.

4. The method of manufacturing a BI-MOS semiconductor integrated device of claim 1, wherein said first dopant type is one type, and said second dopant type is the opposite type, respectively.

5. The method of manufacturing a BI-MOS semiconductor integrated device of claim 1, wherein both said removal of said second oxide film and said removal of said silicon film are completed by photomechanical processes or etching.

* * * * *